United States Patent [19]
Brewitt-Taylor et al.

[11] Patent Number: 5,248,884
[45] Date of Patent: Sep. 28, 1993

[54] INFRARED DETECTORS

[75] Inventors: Raymond Brewitt-Taylor; Charles T. Elliott; Huw D. Rees; Anthony M. White, all of Malvern, England

[73] Assignee: The Secretary of State for Defence in Her Britannic Majesty's Government of the United Kingdom of Great Britain and Northern Ireland, London, England

[21] Appl. No.: 700,925

[22] Filed: Sep. 20, 1984

[30] Foreign Application Priority Data

Oct. 11, 1983 [GB] United Kingdom ............... 8327208

[51] Int. Cl.$^5$ ............... G01J 5/20; H01L 25/00; H01L 27/14
[52] U.S. Cl. ..................... 250/338.4; 250/332; 257/423; 257/436; 257/442
[58] Field of Search ............ 250/332, 338, 338.4; 357/30, 6, 9; 257/436, 432, 442

[56] References Cited

U.S. PATENT DOCUMENTS

| | | | |
|---|---|---|---|
| 2,964,636 | 12/1960 | Cary | 250/338 |
| 3,755,678 | 8/1973 | Javan | 357/9 |
| 4,015,120 | 3/1977 | Cole | 250/338 |
| 4,353,070 | 10/1982 | Pyee | 357/9 |
| 4,445,050 | 4/1984 | Marks | 307/151 |
| 4,531,055 | 7/1985 | Shepherd, Jr. et al. | 250/332 |
| 4,536,658 | 8/1985 | Ludington | 250/332 |

FOREIGN PATENT DOCUMENTS

| | | |
|---|---|---|
| 1017756 | 1/1966 | United Kingdom . |
| 1266529 | 3/1972 | United Kingdom . |
| 1327392 | 8/1973 | United Kingdom . |
| 2051477 | 1/1981 | United Kingdom . |
| 2071414 | 9/1981 | United Kingdom . |

OTHER PUBLICATIONS

L. O. Hocker et al, Appl. Phys. Lett., Jun 15, 1968, vol. 12, #12, p. 401.
R. W. Terhune, Appl. Phys. Lett., Mar. 15, 1977, vol. 30, #6, p. 265.
Schwarz et al, J. Appl. Phys., May 1977, vol. 48, #5, p. 1870.
Electronics Letters, Oct. 1, 1981, vol. 17, #20, p. 729.
Tsang et al, Appl. Phy. Lett., vol. 30, No. 6, Mar. 15, 1977.
Faris et al, Appl. Phy. Lett., vol. 27, No. 11, Dec. 1, 1975.

*Primary Examiner*—Stephen C. Buczinski
*Attorney, Agent, or Firm*—Nixon & Vanderhye

[57] ABSTRACT

An infrared detector comprises a thin film of photo-responsive material on transparent dielectric material with an array of planar antennae adjacent to the film surface. The antennae are separate from ohmic contacts arranged to connect the film to an external circuit. The antennae concentrate radiation in fringe fields at antenna edges and extremities interacting with the photo-responsive material. The detectors may be photovoltaic or photoconductive. The antennae may be rectangular, bow-tie, cruciform, elliptic, circular or square, and are dimensioned for resonance (preferably half-wavelength resonance) at frequencies within the photo-responsive material absorption band. Half-wavelength resonant antennae are best matched by F/0.7 optics. The detector may be a reticulated array. The dielectric material may be formed as a lens.

16 Claims, 4 Drawing Sheets

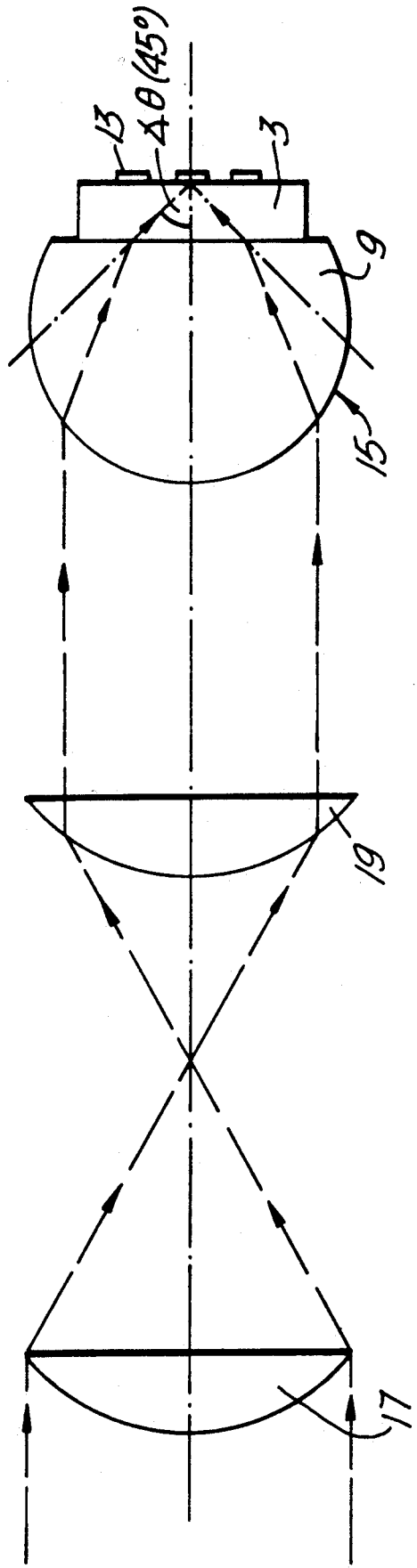

INFRARED DETECTORS

TECHNICAL FIELD

The present invention concerns an infrared detector, particularly an infrared detector of the kind including one or more antennae, so called "antenna-coupled infrared detectors".

In conventional infrared detectors, the same element is used to intercept, collect and to detect radiation. By providing antennae, an enhanced capture cross-section for the collection of radiant energy may be used.

Infrared detectors have application, for example, to thermal imaging, heat seeking, and to alarm sensing.

BACKGROUND ART

Conventional antenna-less infrared detectors—for example bolometers, photovoltaic detectors (diodes), and photoconductive detectors, depend upon effective absorption of incident radiation. This requirement for effective absorption imposes a minimum thickness upon the design of element. In the case of photovoltaic and photoconductive detection, (ie photodetectors) intrinsic semiconductor materials are commonly employed.

The infrared optical absorption coefficients, $\alpha$, for such materials lie typically in the range $10^3$ to $10^4$ cm$^{-1}$. The element thickness needs to be of order or greater than $(1/\alpha)$. For the range of cadmium mercury telluride ternary alloy materials ($Cd_x Hg_{1-x} Te$), this implies an absorption thickness (ie $1/\alpha$) of 10 μm or thereabouts. Extrinsic materials have also been employed. However, the absorption mechanism is much less efficient.

In many instances of application, photodetector performance—in particular the detectivity—is limited by generation-recombination (g-r) noise. This limitation arises, for example, whenever the background flux falling on the detector is very low, or when the detectors cannot be cooled to very low temperatures. Generation-recombination noise in semiconductors is a volume-dependent effect, in fact proportional to square root of volume. Because the requisite detector thickness is high, the noise in consequence is high and the detectivity poor. Also excess carriers generated by photoconversion are distributed over a large volume, and in consequence both excess carrier concentration and responsivity are low. In photoconductive detectors, furthermore, the high thickness implies low resistance and, in consequence, high power dissipation in bias field.

Nonlinear diode, metal whisker, antenna-coupled detectors, both metal-insulator-metal and metal-semiconductor junction devices, have been reported. [See Hocker et al, Appl. Phys. Lett. Vol. 12, No. 12, pp. 401–402, Jun. 15 (1968); and, Tsang et al, Appl. Phys. Lett Vol. 30, No. 6, pp. 263–265, Mar. 15 (1977)]. In these detectors the antennae collect energy from the radiation field and apply it, in the form of a voltage at infrared frequency, to the junctions. This has the effect of producing a change in dc voltage or current. It has been interpreted in terms of rectification of the infrared frequency current, due to nonlinearity of the junction's current-voltage characteristic. [See Faris et al, Appl. Phys. Lett. Vol. 27, No. 11, pp. 629–631, Dec. 1 (1975)]. A more general theoretical study of antenna-coupled infrared detectors has been reported by Schwartz et al. [J. Appl. Phys. Vol. 48 No 5 pp 1870-3 (May 1977)]. This study has shown that noise equivalent power can be reduced considerably by careful design of bolometers. The bolometer detailed comprises a number of thermally sensitive elements interconnected by conductive links, which links are also configured to provide antenna-coupling. The study also details a metal whisker photovoltaic detector, a sharpened tungsten whisker in point contact with infrared photoresponsive semiconductor material. The whisker/semiconductor material combination is a point contact diode since a rectifying contact is provided. Signals are extracted via the whisker. Moreover, the whisker has antenna-like properties at frequencies appropriate to its linear dimensions. To produce an antenna-coupled infrared detector from such an arrangement, it is necessary that field following properties be obtained; ie the detector must follow and rectify signals at infrared frequency. This imposes severe constraints, such as the need for very small geometries to provide low capacitance. The result is high inductance and high resistance with low efficiency and consequent noise. The above-mentioned expert study concluded that it was doubtful that any useful reduction in noise could be obtained for photodetectors by antenna coupling.

DISCLOSURE OF THE INVENTION

The present invention provides an infrared detector including:

(1) a sensing element of infrared absoptive photoresponsive semiconductor material.

(2) contacts to the semiconductor material providing electrical connections to the sensing element, and (3) a structure having antenna properties, the structure being separate from the contacts and arranged to provide interactive fringe field coupling to the sensing element in response to infrared radiation.

Notwithstanding prior art expert opinion to the contrary, it has surprisingly been found possible to obtain significant reductions in noise by means of the invention. Moreover, improvements in both responsivity and detectivity are achievable. The invention makes this possible by separating the contact and structure having antenna properties so that their design may be carried out independently of one another.

The sensing element may have ohmic contacts and a thickness which is small compared to the photo-responsive material absorption length. The structure having antenna properties provides a localised enhancement of radiation energy density in the sensing element, which may therefore be much thinner than required in the prior art. This reduces volume-dependent generation-recombination noise with consequent increase in responsivity and detectivity. Furthermore, reduced element thickness allows higher element resistance. This is advantageous in photoconductive detectors since it reduces power dissipation at a given bias voltage.

The detector of the invention may include a sensing element supporting substrate of infrared transparent dielectric material in optical contact with the sensing element, and one or more planar metal antennae arranged parallel and at least close to the free surface of the element. The one or more antennae provide interactive coupling to the element via fringe fields developed at antenna extremities.

The element may be of photoconductive construction, ie comprised of a single layer of said material, with the contacts spaced apart and in ohmic contact therewith. The thin layer of material afforded by the construction allows achievement of higher contact to contact resistance than allowed hitherto with the advantage of a lower power dissipation for a given magnitude of bias field.

Alternatively, the element may be of photovoltaic construction, ie comprised of two material layers, each of a different excess carrier type, with the ohmic contacts arranged either side of the junction defined by these two layers.

It is preferable that the antenna be of such a length that the antenna is resonant for radiation of wavelength lying within the absorption band of the element material. It is furthermore preferable that this length be such that such resonance is of the lowest order, that it is "half-wavelength" resonance. This has advantage in that a spacing of antennae, commensurate with diffraction spot size for best-matched optics, is achievable, allowing a maximisation of radiation capture.

The antennae, aforesaid, may be narrow or wide rectangular profile, of bow-tie configuration, or elliptic. Structures less sensitive to polarisation, circular or square, may also be utilised.

In a preferred form of construction, the sensing element is coupled with a plurality of regularly spaced antennae. Element material between antennae may be absent, for such material lying outside the effective range of fringe fields is non-contributive. In this latter construction, resistive contacts are provided for interconnection of separated sub-elements of the sensing element.

Best optical matching for short antennae is achievable with F/0.7 optics. The substrate may itself, in conjunction with the layer material, be shaped to function as a compound lens. It may be used then for wide angle application, or may be combined with telescopic or other suitable optics for imaging or other applications.

BRIEF INTRODUCTION OF THE DRAWINGS

In the drawings accompanying this specification:

FIG. 5 is an illustrative drawing of a lens mounted detector with an optical assembly;

DESCRIPTION OF EMBODIMENTS

Embodiments of the invention will now be described, by way of example only, with reference to the accompanying drawings.

Figure 1:
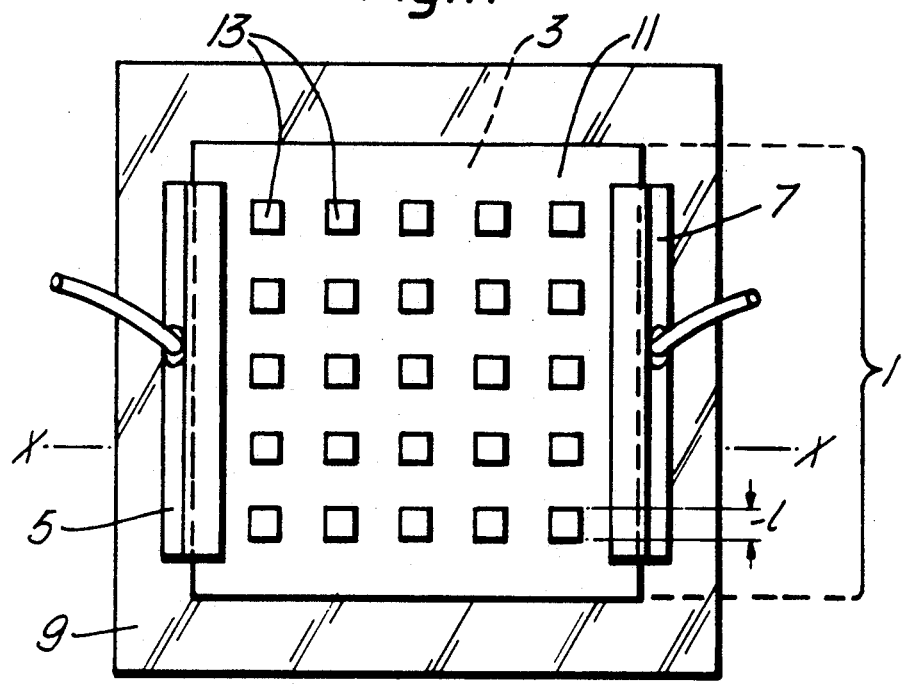
FIGS. 1 and 2 show in illustrative plan and cross-section respectively an antenna-coupled photodetector, and a photoconductive detector embodying the features of this invention.
Figure 2:
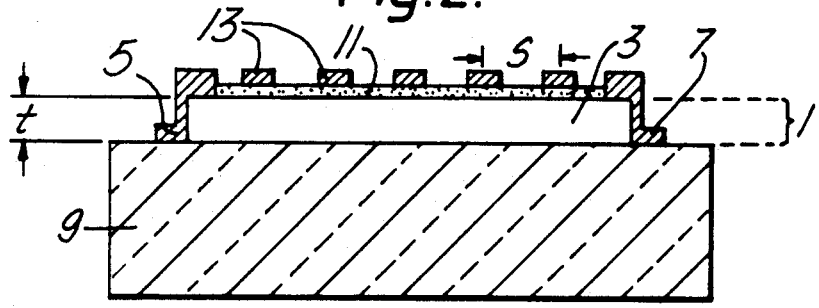

An antenna-coupled infrared photodetector 1 is depicted in FIGS. 1 and 2. This photodetector is comprised of a single photoconductive element formed of a thin single layer 3 of infrared absorptive photoresponsive material, and provided with two bias contacts, ohmic end contacts 5 and 7. The layer 3 is supported by a substrate 9 of infrared transparent dielectric material and is in intimate optical contact therewith. Surface passivation of the layer material is afforded by a very thin surface coating 11, a coating of only several Angstroms thickness. A number of metal antennae 13 are arranged over and in contact with the coated surface of the layer 3. These are of planar construction and are uniformly spaced over the area of the surface. Factors governing the choice of materials, device geometry and optics design will now be considered:

CHOICE OF MATERIALS

The photoresponsive material may be either extrinsic or intrinsic. The latter, however, is by far the more preferable, for such material affords greater photoconversion efficiency. Of the intrinsic materials, material selected from the cadmium mercury telluride $Cd_xHg_{1-x}Te$ ternary alloys are very suitable. The energy bandgap characteristic of this range of alloys can be selected, by choice of alloy composition, to suit the particular infrared application. Alloy composition can be chosen to give optimal photoconversion for either of the 3 to 5 $\mu$m or 8 to 14 $\mu$m wavelength band atmospheric windows. The dielectric constant varies from a value of 12 (x=1, CdTe) to a value of 20 (x=0, HgTe) over the compositional range. The cadmium mercury telluride alloy $Cd_xH_{1-x}Te$, x=0.205 for example, has a cutoff at a wavelength $\lambda_c \simeq 10$ $\mu$m for a temperature of 150K ($-123$C), and can then be selected for 8-10 $\mu$m wavelength band detection. The dielectric constant $\epsilon$ of this chosen material is of value 18 approx.

For detectors of the kind disclosed herein, radiation is directed to the antennae through the substrate medium. Infrared transparent material is therefore requisite; the attenuation should be minimal. Cadmium telluride material is considered as suitable. It is transparent to radiation in each of the 3-5 $\mu$m and 8-14 $\mu$m bands. It also affords a reasonable lattice contant match and thermal expansion coefficient match to the range of cadmium mercury telluride alloys. It thus affords a suitable substrate for the epitaxial deposition of cadmium mercury telluride, and affords mechanical integrity when subjected to normal thermal cycling. The refractive indices of cadmium telluride and the range of cadmium mercury telluride alloys are similar (they differ by a factor between 0.8 and 1.0 over the range) and therefore optical mismatch reflection at the substrate-layer interface 9/3 is minimal. Where the layer 3 is very thin; ie thin in relation to wavelength in the material, the properties of the antennae are affected by the substrate material. In such instance a substrate dielectric constant of value 8 or greater is preferred. The dielectric constant $\epsilon$ of cadmium telluride has a value 12.

It is also desirable that as much as possible of the radiation collected by the antennae is reradiated and directed into the absorptive layer 3. It follows that the antenna metal should be chosen so that it affords minimal resistive loss. The most suitable materials are those metals characterised by both high electron density and high mobility—for example: copper; the noble metals: silver; gold; or, the alkali metals.

The losses are due to infrared frequency skin effect resistance. Account is taken of the fact that this effect is anomalous; the electron scattering rate $1/\tau$ is less than the radiation angular frequency $\omega$. The current density $J(\omega)$ and electric field $E(\omega)$ are related by the expression:

$$J(\omega) = \{\sigma_o/(1+j\omega\tau)+j\omega\epsilon\} \cdot E(\omega) \qquad \text{Expression (1)}$$

where $\sigma_o$ is the DC conductivity, $\tau$ the momentum relaxation time and $\epsilon_o$ the permittivity of free space. The effective sheet resistivity $R_s$ of metal at microwave frequencies $(\omega\mu_o/2\sigma_o)^{\frac{1}{2}}$ saturates at $\omega=1/\tau$, and thus at infrared frequency:

$$R_s = (\mu_o/2\sigma_o \cdot \tau)^{\frac{1}{2}} \qquad \text{Expression (2)}$$

This is lowest for high mobility, high electron density. Evaluation of this expression (2) gives a typical value $$R_s \sim 0.5 \ \Omega/\square @ 300K \ (30C)$$

for silver metal.

Device Geometry (i) Antenna dimensions and shape

Antenna response is most efficient at resonant wavelength. Antenna length is, in preference, chosen so that the antennae are resonant at a frequency lying within the wavelength band of interest. The length affording "half-wavelength" resonance furthermore is preferable over longer resonant lengths, because this length allows a denser packing of antennae, and indeed, as will be discussed below, such antennae can be packed a diffraction spot diameter apart, allowing most efficient collection of incident radiation. Such dense packing is not possible for one-and-a-half wavelengths and longer resonant structures, and in consequence collection would be less efficient.

The "half-wavelength" resonant length $L_{\frac{1}{2}}$ may be expressed in terms of radiation wavelength $\lambda_v$, the ratio $\epsilon_r$ of the dielectric constants of the media each side of the antennae, and a numerical factor $K_s$ dependent on the shape of antennae:

$$L_{\frac{1}{2}} = K_s \cdot \lambda_v / \sqrt{[\frac{1}{2} \cdot (\epsilon_r + 1)]} \qquad \text{Expression (3)}$$

$$\approx \sqrt{2} \cdot K_s \cdot \lambda_m, \ \epsilon_r \gg 1 \qquad \text{(Expression (3a))}$$

where $\lambda(\lambda_m = \lambda_v/\sqrt{\epsilon_r})$ is the wavelength of radiation within the layer material. [Where the layer 3 is very thin, account must be taken of the substrate 9, and the above expression must be modified accordingly].

The choice of antenna shape is not critical. The shape factor $K_s$ approaches a value of 0.5 for very thin antennae, has a value of 0.45 for a length/width aspect ratio of 10:1, and has a value of 0.35 approx. for wider or bow-tie shaped antennae.

Evaluation of expression (3a) for the chosen cadmium mercury telluride material, air mounting, ($\epsilon_r = 18$) gives an antenna length:

$$L_{\frac{1}{2}} \approx 1.5 \ \mu m, \ 10:1 \ \text{aspect} \ @ \ 10 \ \mu \ \text{wavelength}$$

Other antennae shapes—square, elliptic, cruciform, or circular can be utilised, these being less sensitive to or independent of optical polarisation. These correspond to different values of shape vector $K_s$, and the length and spacing of antennae must be chosen accordingly.

Optical antenna spacing and optics design are related; spacing will be discussed later.

(ii) Layer thickness

Provided that the layer 3 is very thin ($\lesssim \lambda_m/15$), it is found that the infrared absorption efficiency depends on sheet resistivity rather than upon thickness and conductivity taken independently. Layer thickness is chosen to give an appropriate value of sheet resistivity, a value satisfactory for the intended application.

To calculate the absorption, the infrared absorptive layer can be treated as a lossy conductive sheet, a distributed load across each antenna 13. Maxwell's equations have been solved numerically for thin "half-wavelength" resonant antennae upon a conductive sheet. The results of these calculations are presented in Table 1 appearing below. For comparison, the absorption resulting from antenna-less detectors of the same sheet resistivity have also been computed and are also presented.

[In a lossy conducting medium, the propagation constant K ($K = \alpha + j\beta$) is complex:

$$K^2 = \omega^2 \mu \epsilon (1 - j\sigma/\omega\epsilon);$$

For cadmium mercury telluride material the ratio $\sigma/\omega\epsilon$ of conduction to displacement current is small ($\sim 1/30$):

$$\beta \approx \frac{\sigma}{2} \cdot \sqrt{\frac{\mu}{\epsilon}}.$$

After passing through the lossy medium the radiant power is attenuated a factor $\exp(-2\beta t)$ where t is the layer thickness.

The fractional loss of power P, ie the fraction absorbed:

$$\frac{\Delta P}{P} \approx 2\beta t \qquad \text{Expression (4)}$$

$$\approx \sqrt{\frac{\mu}{\epsilon}} \div (1/\sigma t)$$

ie the ratio of the characteristic impedance of the medium to the sheet resistance of the layer.

For the chosen cadmium mercury telluride material ($\epsilon = 18$), the characteristic impedance is 89 $\Omega$.

TABLE I

| Absorption by conducting sheet with and without antenna coupling. | | |
|---|---|---|
| Sheet resistivity (K$\Omega/\square$) | Transmission loss (%) | Absorption without antenna (%) |
| 0.5 | 65 | 18 |
| 1.0 | 51 | 9 |
| 2.0 | 32 | 4.5 |
| 5.0 | 22 | 1.8 |
| 10.0 | 14 | 0.9 |

Thus it is shown that an antenna-coupled layer of sheet resistivity 500 $\Omega/\square$ would give about 65% absorption of the incident radiation. [This assumes 100% efficient capture of incident radiation by the antenna and negligible metal loss.] For higher sheet resistivity the absorption is reduced, and in particular for 1 K$\Omega/\square$ and 10 K$\Omega/\square$ sheet resistivities the absorption efficiency is approximately 50% and 15%. For sheet resistivity higher than about 10 K$\Omega/\square$, the absorption varies inversely as the sheet resistivity. The absorption in the case of antenna coupling is greater than that obtaining for an antenna-less structure, most particularly for the higher sheet resistivities where the absorption is an order of magnitude more efficient. The practical sheet resistivity for an intrinsic absorber such as a layer of cadmium mercury telluride material is of order 10 K$\Omega/\square$ for a layer thickness of 0.1 $\mu$m. For such a thin layer the relative increase in absorption by antenna coupling is large (a factor of 10 or so). Use of thicker layers (ie lower sheet resistivity) allows only a comparatively small relative improvement due to the antenna action, but may be desirable to offset the contribution of recombination/generation processes at the layer interface with the substrate 9.

Other design criteria:

Design of optics and choice of antenna spacing

Figure 3:
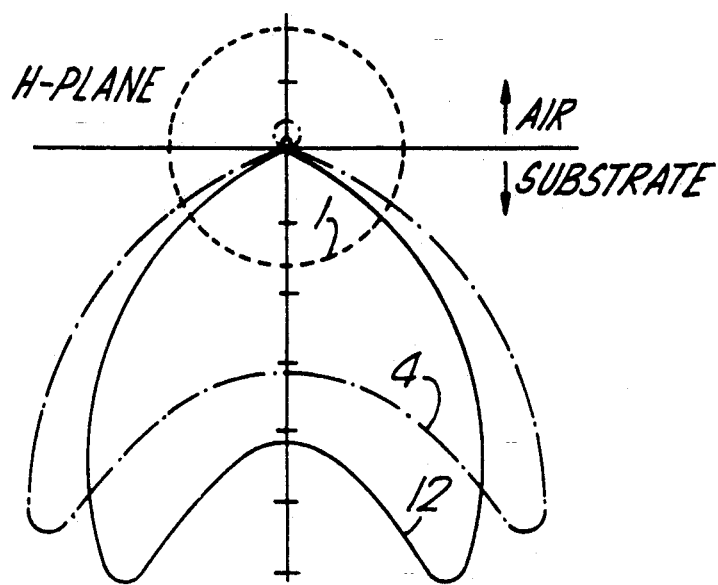
FIGS. 3 and 4 are gain polar diagrams of a planar antenna upon a dielectric substrate for the H-plane and E-plane respectively.
Figure 4:
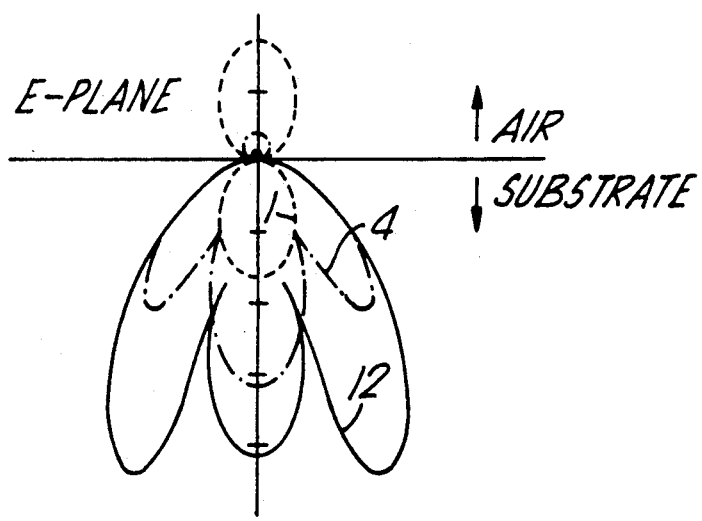

Calculation of the transmission properties of planar dipole antennae on a dielectric surface shows that they are characterised by strong directivity of the radiation, the power division in each medium varying approximately as $\epsilon_r^{3/2}$. [See Brewitt-Taylor et al, "Planar antennas on a dielectric surface", Electronic Letters Oct. 1, 1981 Vol. 17 No 20 pp 729–731. FIGS. 3 and 4 herewith reproduce their far field polar diagrams.]

FIGS. 3 and 4 show the far field polar diagrams for a dipole at a dielectric/air interface for dielectric constants ratio $\epsilon_r$ of 1, 4 and 12. These diagrams are for resonant dipoles, but the sensitivity to frequency is quite weak. FIG. 3 is for the H-plane, ie the plane normal to the dipole current, and FIG. 4 for the E-plane. For $\epsilon_r \gtrsim 8$ the transmitted beam in the dielectric approximates to a cone of semiangle 45°. A corollary observation is that such an antenna will also only be responsive to radiation directed into a cone of like semiangle.

The optimum design of optics for the detector 1 is thus one that will converge radiation collected from the far scene into a beam of ultimate cone semi-angle $\theta \simeq 45°$ (ie 0.7 rads). Such an optical arrangement is shown in FIG. 5. The lens of this arrangement, as shown, is a compound lens comprised of the infrared absorbtive layer 3 and the dielectric substrate 9. The front surface 15 of the dielectric substrate 9 has been shaped as a hyperhemispherical lens, and its curvature chosen so that radation is focussed upon the antennae 13, ie the antennae 13 lie in the focal plane of the compound lens. The F-number of this lens of focal length f and diameter D is thus given by:

$$\theta = \frac{D}{2f} = \frac{1}{2F} = 0.7 \qquad \text{Expression (5)}$$

$$\therefore F = 0.7.$$

ie the best possible match is provided by an F/0.7 lens. Were the lens of a larger diameter for the same focal length, ie F<0.7, only a part of the radiation collected by the lens would be converged into the cone of semi-angle 45°. Radiation converged from the periphery of the lens would not couple effectively to the antennae. On the other hand, were the lens of a smaller diameter, F>0.7, there would be an overspill loss in efficiency—the size of diffraction spots would be unnecessarily large.

The field of view of the optical system can be changed by including telescope optics 17, 19 (ie parallel beam in and out) of any desired angular magnification, such a system does not change the size of diffraction spot. A proviso is that the optical system does not contain any aperture so small as to increase the diffraction spot size beyond that given by the final lens aperture discussed above.

For optimum antenna spacing, it is arranged that each antenna is located at the first diffraction null in the pattern of adjacent antennas—ie the centre to centre spacing of the antennae is a diffraction spot diameter. The size of diffraction spot d is a function of lens F/number and wavelength:

$$d = 1.22\, F\, \lambda_m \qquad \text{Expression (6)}$$

Thus from expressions (3a) and (6), the antenna length and spacing are related as:

$$\frac{d}{L_{\frac{1}{2}}} = \frac{1.22\, F}{K_s \cdot \sqrt{2}} \qquad \text{Expression (7)}$$

$$= 1.34$$

for $K_s = 0.45(10:1 \text{ aspect})$, F/0.7.

Were the spacing of larger value, less radiation would be collected as it would lie outside the antenna apertures, and there would be a loss of efficiency.

Thus a square profile detector of side 10 μm would utilise some twenty-five antennae (5×5 square lattice array) or some sixty (hexagonal close-packed 2-D lattice array).

For antennae of intermediate length (ie $L > \sqrt{2} \cdot \lambda_m$), the radiation pattern narrows in the plane of the antenna length:

$$\theta = \lambda_m / L.$$

The corresponding spacing/length relation becomes $$\frac{d}{L} = 0.61$$

This is less than the antenna length, the antennas cannot be packed at this spacing. The possibility of diffraction spot spacing depends on the use of small antennae. Where large antennae are used, the diffraction spacing can be increased by using a larger focal length with the same optics diameter; this however would introduce loss of efficiency due to radiation pattern mismatch.

For long antennae (ie $L > 2.2\, \lambda_m$), the radiation pattern has a different shape, which does not provide good coupling to the optical system, so that antennas of this length are undesirable.

It is noted that an antenna "half-wavelength" resonant for radiation in the 8–12 μm band can also be "one-and-a-half wavelength" resonant for radiation in the 3 to 5 μm band, albeit the efficiency for the latter band would necessarily be somewhat poor.

Figure 6:
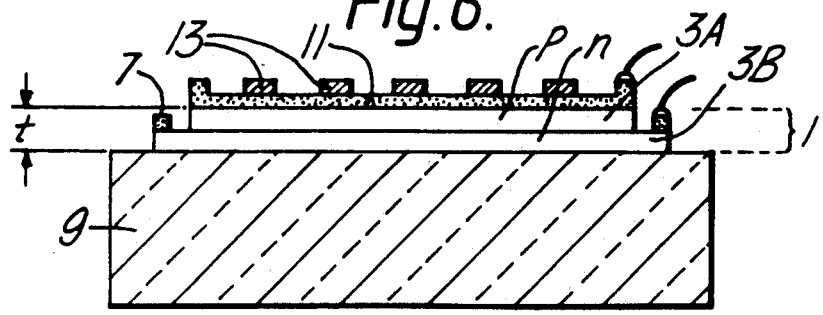
FIG. 6 is an illustrative cross-section view of a photovoltaic antenna-coupled detector.

An antenna-coupled infrared photovoltaic detector is shown in FIG. 6. Here, the element 3 is a two layered structure, a junction photodiode, comprised of a p-type layer 3A adjacent to the antennae, and an underlying n-type layer 3B, and having ring ohmic contacts 5 and 7, one adjacent to each layer. The total thickness of the two-layered structures would be similar to that of the single layer of the photoconductive structure already discussed.

Figure 7:
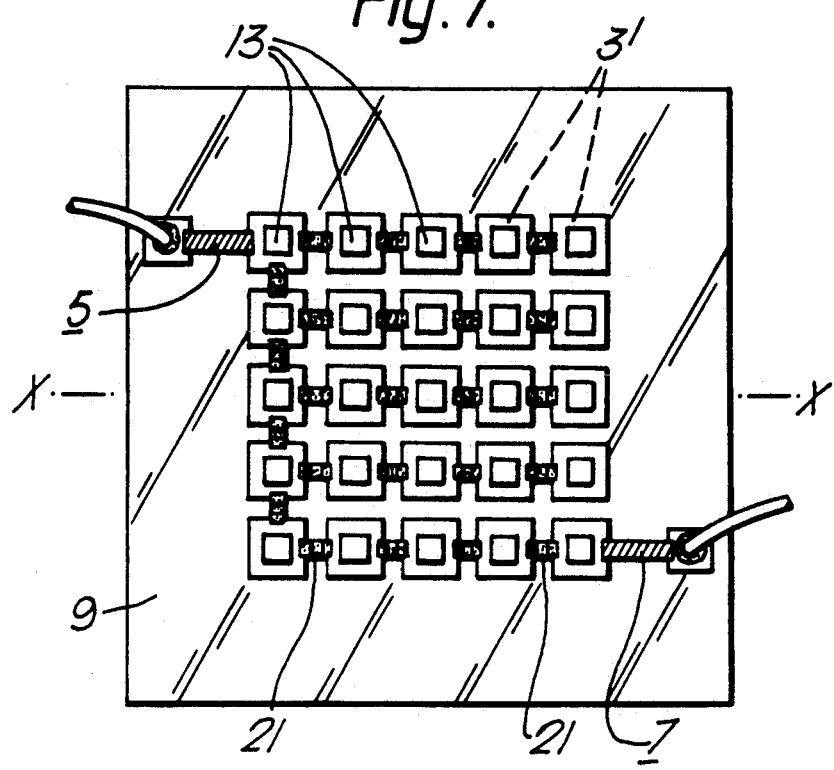
FIGS. 7 and 8 show an illustrative plan and cross-section, respectively, a reticulated antenna-coupled detector; and, FIG. 9 shows in illustrative plan view an integrating strip antenna-coupled photoconductive detector.
Figure 8:
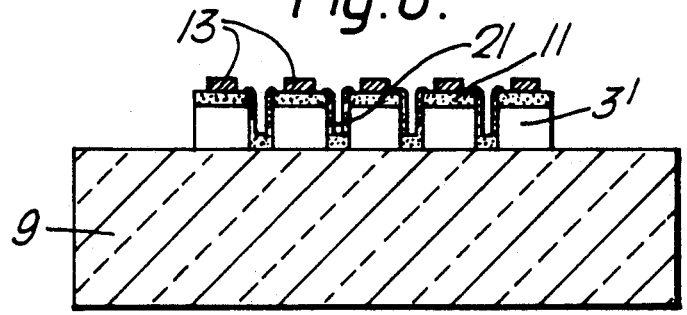

A further variant, a reticulated antenna-coupled photoconductive detector, is shown in FIGS. 7 and 8. Here the photoconductive material 3 has been reticulated to leave islets of material 3'. On each islet there is a single antenna 13. The islets 3' are interconnected by resistive links 21. All islets 3' are connected in series in meander manner.

The invention is also applicable to integrating strip detectors (see UK Patent No 1,488,258). For this type of detector the element 3 is in the form of an elongate strip—see FIG. 9. Bias contacts 5 and 7 are provided and, between these, a readout contact 23 either ohmic or diodic. This detector is adapted by the provision of an array of antennae 13 upon its surface. In operation, an image is scanned along the detector towards the readout. A bias current is applied via contacts 5 and 7 and the current level is set so that the forced drift of photocarriers towards the readout is at a velocity matched to the velocity of the moving image. Stepwise discrete summation of photocarriers therefore takes place as the photocarriers drift beneath the antennae and collect carriers generated in the fringe fields.

Figure 9:
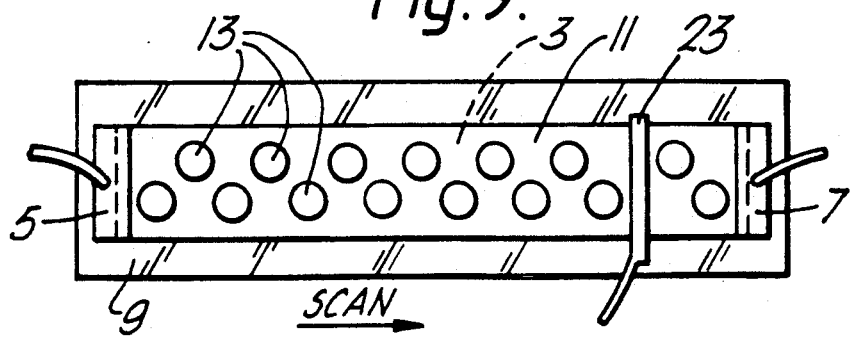

The strip-detector shown in FIG. 9 may also be used in a staring mode. For this application, photocarriers are allowed to accumulate and a bias pulse is applied to drive the photocarriers to the readout after a period of integration.

Whereas the foregoing description has referred to descrete metal antennae 13 adjacent to but separate from the photo-responsive material 3, other forms of antennae may be employed for the purposes of the invention. It is necessary to provide a structure having antenna properties which is separate from electrical contacts 5 and 7 to the material 3, the structure being arranged to provide interactive fringe field coupling to the material 3 in response to infrared radiation. Such a structure may taken many forms, and in particular need not necessarily lie on the surface of a sensing element or its passivating layer. Examples of appropriate structures include antenna-like regions which are:

(1) appropriately doped semiconductor regions,
(2) islands grown on a material of differing doping or chemical composition,
(3) embedded regions in a material of differing chemical composition, and
(4) slots or cavities in the sensing element.

Necessarily, the structure conductivity and geometry would be determined by calculation along the lines previously indicated.

We claim:

1. An infrared detector of multilayer construction and including:
   (1) a sensing element comprising at least one layer of infrared absorptive photo-responsive semiconductor material,
   (2) an antenna layer comprising at least one discrete antenna arranged over and radiatively coupled to said sensing element layer, said at least one antenna having a radiation absorption resonance for at least one infrared wavelength absorbed by the sensing element and being disposed such that fringe electric fields developed at antenna extremities in response to radiation absorption produce localised enhancement of radiation energy density within said sensing element, and
   (3) ohmic electrical contacts to said sensing element, the contacts being separate from said at least one antenna and providing an output path for electrical signals developed in said sensing element in response to radiation absorption.

2. An infrared detector according to claim 1 wherein said sensing element has a thickness which is less than the sensing element semiconductor material absorption length at said radiation absorption wavelength.

3. An infrared detector according to claim 1 wherein said sensing element is supported by a substrate of dielectric material transparent to radiation of wavelength for which said at least one antenna is resonant.

4. An infrared detector according to claim 1 wherein said at least one layer of semiconductor material is a single layer of single excess carrier type, the detector being photoconductive.

5. An infrared detector according to claim 1 wherein said at least one layer of semiconductor material comprises two layers of semiconductor material of differing excess carrier type having a pn junction interface therebetween, and said electrical contacts comprise respective contacts to the semiconductor material layers.

6. An infrared detector according to claim 1 wherein said at least one antenna is at least one planar metal antenna arranged substantially parallel to a sensing element layer surface.

7. An infrared detector according to claim 1 wherein the said at least one antenna is arranged for half-wavelength resonance in a band comprising one of wavelength intervals 3 to 5 microns and 8 to 14 microns.

8. An infrared detector according to claim 1 wherein said at least one antenna has a configuration which is any one of rectangular, bow tie, elliptic, circular, cruciform and square.

9. An infrared detector according to claim 1 wherein said antenna layer is discontinuous and comprises an array of discrete antennae.

10. An infrared detector according to claim 1 wherein said sensing element is reticulated to define semiconductor material islets each with a respective antenna.

11. An infrared detector according to claim 10 wherein said islets are connected together in series.

12. An infrared detector according to claim 1 wherein said sensing element is supported by a substrate of dielectric material transparent to radiation of wavelength for which said at least one antenna is resonant, the substrate and sensing element being arranged to form a compound lens for focussing radiation upon said at least one antenna.

13. An infrared detector according to claim 12 wherein said compound lens has an F-number of substantially 0.7.

14. An infrared detector according to claim 13 wherein said compound lens is hyper-hemispherical.

15. An infrared detector according to claim 1 wherein said sensing element has a surface bearing a passivating layer and said at least one antenna is disposed on the passivating layer.

16. An infrared detector including:
   (1) a sensing element comprising at least one layer of infrared absorptive photo-responsive semiconductor material,
   (2) at least one antenna having a radiation absorption resonance for at least one infrared wavelength absorbed by the sensing element and being disposed such that fringe electric fields developed at antenna extremities in response to radiation absorption produce localised enhancement of radiation energy density within the sensing element, said at least one antenna comprising at least one of any one of a metal layer, a doped semiconductor region of a sensing element surface, an island grown on a sensing element surface, a material embedded in a sensing element surface and a cavity in a sensing element surface, and
   (3) ohmic contacts to said sensing element, the contacts being separate from said at least one antenna and providing an output path for electrical signals developed in said sensing element in response to radiation absorption.

* * * * *